United States Patent
Koyama et al.

(10) Patent No.: US 7,675,512 B2
(45) Date of Patent: Mar. 9, 2010

(54) MEMORY CIRCUIT, DISPLAY DEVICE AND ELECTRONIC EQUIPMENT EACH COMPRISING THE SAME

(75) Inventors: Jun Koyama, Kanagawa (JP); Tomoaki Atsumi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1316 days.

(21) Appl. No.: 10/890,110

(22) Filed: Jul. 14, 2004

(65) Prior Publication Data

US 2005/0013180 A1 Jan. 20, 2005

(30) Foreign Application Priority Data

Jul. 18, 2003 (JP) .............................. 2003-277068

(51) Int. Cl.
  *G09G 5/00* (2006.01)
(52) U.S. Cl. ..................................... 345/205
(58) Field of Classification Search ................. 345/205, 345/77; 365/185.01, 189.07, 201, 203, 202, 365/206
See application file for complete search history.

(56) References Cited

U.S. PATENT DOCUMENTS

| | | | |
|---|---|---|---|
| 4,866,673 A | | 9/1989 | Higuchi et al. |
| 4,879,690 A | * | 11/1989 | Anami et al. ............... 365/201 |
| 4,942,555 A | | 7/1990 | Higuchi et al. |
| 5,046,052 A | | 9/1991 | Miyaji et al. |
| 5,070,482 A | | 12/1991 | Miyaji |
| 5,202,855 A | * | 4/1993 | Morton ........................ 365/226 |
| 5,327,377 A | | 7/1994 | Kawashima |
| 5,488,387 A | * | 1/1996 | Maeda et al. ................. 345/89 |
| 5,771,190 A | | 6/1998 | Okamura |
| 5,774,411 A | | 6/1998 | Hsieh et al. |
| 6,044,020 A | | 3/2000 | Chung et al. |
| 6,477,092 B2 | | 11/2002 | Takano |
| 6,580,658 B1 | | 6/2003 | Hsu et al. |
| 2001/0020840 A1 | | 9/2001 | Kojima |
| 2001/0022581 A1 | * | 9/2001 | Koyama et al. ............. 345/204 |
| 2003/0076149 A1 | * | 4/2003 | Haga ........................ 327/333 |

FOREIGN PATENT DOCUMENTS

EP 0 345 065 A2 12/1989

(Continued)

OTHER PUBLICATIONS

Guest Paper; *Nikkei Electronics, No. 841*; pp. 123-130; Feb. 2003 (Translation: Concise Statement).

(Continued)

*Primary Examiner*—Richard Hjerpe
*Assistant Examiner*—Shaheda A Abdin
(74) *Attorney, Agent, or Firm*—Fish & Richardson P.C.

(57) ABSTRACT

A memory circuit using a thin film transistor has been problems such as the drop in yield and the decrease in speed of response of the memory circuit due to variations in transistors. The purpose of the invention is to improve the yield and speed of the response of a memory cell by driving a word line by a voltage which is different from the logical amplitude of the memory cell. The invention is applicable to an SRAM, a DRAM, a mask ROM, and the like. A memory circuit of the invention is formed integrally with a display device for realizing a multi-functional display device.

58 Claims, 17 Drawing Sheets

| | FOREIGN PATENT DOCUMENTS | | | JP | 2001-343933 | 12/2001 |
|---|---|---|---|---|---|---|
| EP | 1 103 946 A2 | 5/2001 | | | | |
| JP | 62-245592 | 10/1987 | | | | |
| JP | 02-003171 | 1/1990 | | | | |
| JP | 02-265097 | 10/1990 | | | | |
| JP | 04-345992 | 12/1992 | | | | |
| JP | 2001-312893 | 11/2001 | | | | |

OTHER PUBLICATIONS

European Office Action (European Application No. 04 015 529.3—2210) mailed Aug. 30, 2007, 3 pages.

European Search Report (Application No. 04015529.3), Apr. 6, 2006, 3 pages.

\* cited by examiner

BLOCK DIAGRAM OF INTEGRALLY FORMED PDA (INTEGRALLY FORMED WITHIN DASHED LINE)

MEMORY CIRCUIT, DISPLAY DEVICE AND ELECTRONIC EQUIPMENT EACH COMPRISING THE SAME

BACKGROUND OF THE INVENTION

1. Field of the Invention

The present invention relates to a memory circuit, and more particularly to a memory circuit configured with thin film semiconductor elements. The invention also relates to a display device comprising the memory circuit.

2. Description of the Related Art

In recent years, mobile phones have been widely used with the advance of the communication technology. In the future, transmission of moving images and transmission of a larger amount of information are expected. On the other hand, by reducing the weight of personal computers, those adapted for mobile communication have been produced. Information terminals called PDAs originated in electronic notebooks have also been produced in large quantities and widely used. In addition, most of such portable information equipment includes a flat panel display because of the development of display devices.

Particularly, among active matrix display devices, manufacturing of a display device using a low temperature poly-silicon thin film transistor (hereinafter, a thin film transistor is referred to as a TFT) has been promoted in recent years. By using the low temperature poly-silicon TFT, a signal line driver circuit can be integrally formed around a pixel portion as well as a pixel. Thus, the low temperature poly-silicon TFT allows the compactness and the high definition of a display device and it is expected to be more widely used in the future.

As the one using the low temperature poly-silicon TFT, a controller circuit, a CPU, and a memory circuit in addition to the pixel and the signal line driver circuit have been produced. (For example, Non-patent Document 1)

[Non-Patent Document 1]
Nikkei Electronics, No. 841, Feb. 17, 2003, pp. 123-130

Forming such a logical circuit integrally with a pixel by using a TFT contributes to the formation of a display system on a glass substrate.

A memory circuit is a typical circuit which is required for forming a system. The memory circuit includes a volatile memory circuit such as an SRAM and a DRAM and a non-volatile memory circuit such as a flash memory and a mask ROM.

The memory circuit comprises a Y decoder 201, a Y selector 202, an X decoder 203, and a memory cell array 204 as shown in FIG. 2. The X decoder 203 selects a word line based on an inputted address signal. The Y decoder 201 selects a switch which is included in the Y selector 202 and connected to a bit line based on an inputted address signal similarly. An address is inputted to the Y decoder 201 and the X decoder 203 so that one memory cell in the memory cell array 204 can be specified and data can be written in or read from the specified memory cell.

Note that the X decoder and the Y decoder are referred to as a row decoder and a column decoder respectively in some cases. They are indicated as an X decoder and a Y decoder in this specification. In addition, a wire in the X direction and a wire in the Y direction which are included in the memory cell array 204 are indicated as a word line and a bit line respectively. The word line is driven by the X decoder 203 in FIG. 2. The X decoder 203, the Y decoder 201, the Y selector 202 and the memory cell array 204 are generally driven by a common power source, a high potential power source of which is indicated as an VDD and a low potential power source thereof is indicated as a VSS in FIG. 2.

A memory element had better have as small memory cell as possible for large memory capacity. It requires the reduction in the number of transistors configuring a memory cell. Each of a mask ROM and a DRAM has a memory cell configured with one transistor while an SRAM has a memory cell configured with six transistors. In addition, such a transistor serves both for writing and for reading. The explanation is made on the case of the SRAM hereinafter.

FIG. 3 shows a memory cell of a conventional SRAM. Only one memory cell 302 is shown in FIG. 3 for simplification, however, the number of memory cells is not limited to one. The memory cell 302 of the SRAM comprises an inverter circuit configured with a TFT 308 and a TFT 310, an inverter circuit configured with a TFT 309 and a TFT 311, and switching transistors 312 and 313.

A writing operation thereof is explained below. When the potential of a specified word line 305 becomes Hi by an X decoder 301, the switching transistors 312 and 313 are turned ON so that data is written in a pair of inverter circuits configured with the TFTs 308 to 311. When the writing is finished, the switching transistors 312 and 313 are turned OFF so that the data which has been written in a pair of inverters is held.

A reading operation is explained next. Firstly, bit lines 303 and 304 are precharged at a certain potential from the outside of the memory cell array. Generally, a precharge potential is set to the nearly middle of a power source of a pair of inverters in a memory cell. After the completion of the precharge, the bit lines 303 and 304 are released from the precharge potential so that the bit lines 303 and 304 are in the floating state. Next, When the potential of the word line 305 becomes Hi and the switching transistors 312 and 313 are turned ON, the bit lines 303 and 304 are each driven in the opposite direction by the pair of inverters and a voltage difference therebetween is detected by a sense amplifier (not shown) so that the data is called out.

SUMMARY OF THE INVENTION

The memory circuit configured with thin film semiconductors as described above has the following problem. That is, a transistor using a thin film semiconductor, particularly using polycrystalline silicon, leads to larger variations in transistor characteristics such as the mobility and the threshold value compared with a transistor using monocrystalline silicon.

FIG. 4 shows a memory cell of an SRAM. When writing data, the logical collision occurs in the case where reverse data of data to be written in the memory cell, that is, an L (meaning low hereinafter) corresponding to an H (meaning high hereinafter) to be written or an H corresponding to an L to be written is stored. In view of this, the writing capability of the switching transistor stronger than the holding capability of the pair of inverter circuits is required.

It is assumed here that a drain of a TFT 406 holds an L while a drain of a TFT 407 holds an H in an inverter circuit configured with a TFT 404 and the TFT 406 and in an inverter circuit configured with a TFT 405 and the TFT 407, respectively. When writing, an H and an L are supplied to bit lines 402 and 403 respectively and a TFT 408 and a TFT 409 are turned ON. Then, current flows through the bit line 402, the TFT 408, the TFT 406, and a low potential power source 411 and through a high potential power source 410, the TFT 405, the TFT 409, and the bit line 403, respectively.

In the case where the TFT 408 has a larger current capacity than the TFT 406 here, the drain potential of the TFT 406 is increased to enable to write the H. Furthermore, in the case where the TFT 409 has a larger current capacity than the TFT 405, the drain potential of the TFT 407 is decreased to enable to write the L. When the TFT 406 has a larger current capacity than the TFT 408, the writing cannot be performed as well as in the case where the TFT 405 has a larger current capacity than the TFT 409.

Large variations in transistor characteristics cause such a problem. For solving the problem, it is effective to make the size of the switching transistor large enough to increase the current capacity thereof, which, however, makes the size of the memory cell itself large and leads to a result adverse to the aforementioned intention that the integration density of a memory circuit is improved.

In addition, data of a memory cell is outputted to a bit line in practice when reading data. However, in the case where a switching transistor has a too large current capability, a precharge potential is written in the memory cell when reading, and thus data varies. For solving the problem, it may be effective to make the size of transistors configuring a pair of inverter circuits large, which, however, makes the size of the memory cell large and leads to a result adverse to the high integration.

Such operation failure and the drop in yield of a memory element due to the decrease in the integration degree increase the cost. Particularly in the case of a display device integrating a memory circuit, the cost is increased great deal for the whole display device.

In order to solve the above-described problem, according to the invention, the current capability of a writing or reading transistor is varied by making a difference between the signal amplitude of a word line and the signal amplitude in a memory cell. Consequently, the operation failure in writing and reading can be reduced without making the size of the memory cell large.

A memory circuit of the invention comprises a word line, a plurality of memory cells, and a word line driver circuit which drives the word line. The word line driver circuit comprises a level shift circuit, and the output amplitude of the memory cell and that of the level shift circuit differ from each other.

A memory circuit of the invention comprises a word line, a plurality of memory cells, and a word line driver circuit which drives the word line. The word line driver circuit comprises a level shift circuit, and the output amplitude of the level shift circuit is larger than that of the memory cell.

A memory circuit of the invention comprises a word line, a plurality of memory cells, and a word line driver circuit which drives the word line. The word line driver circuit comprises a level shift circuit, and the output amplitude of the level shift circuit is smaller than that of the memory cell.

A memory circuit of the invention comprises a word line, a plurality of memory cells, and a word line driver circuit which drives the word line. The word line driver circuit comprises a level shift circuit, and the level shift circuit has a means for varying the output amplitude.

A memory circuit of the invention comprises a word line, a plurality of memory cells, and a word line driver circuit which drives the word line. The word line driver circuit comprises a level shift circuit, and the level shift circuit has a means for varying the output amplitude between when writing and reading.

In a memory circuit of the invention according to the above-described configurations, the amplitude of a level shift circuit is controlled by a CPU.

A memory circuit of the invention comprises a word line, a plurality of memory cells, and a word line driver circuit which drives the word line. The word line driver circuit comprises a level shift circuit. As for the output amplitude of the level shift circuit, the amplitude in writing is larger than the amplitude in reading.

According to the above-described configurations, a memory circuit of the invention is an SRAM circuit.

According to the above-described configurations, a memory circuit of the invention is a DRAM circuit.

According to the above-described configurations, a memory circuit of the invention is a mask ROM.

According to the above-described configurations, a memory circuit of the invention is configured with thin film transistors.

A display device of the invention is provided with the above-described memory circuit.

In a display device of the invention according to the above-described configurations, a display portion is configured with thin film transistors and a memory circuit is formed integrally with the thin film transistors of the display portion.

A display device of the invention is a liquid crystal display device with the above-described configurations.

A display device of the invention is an EL display device with the above-described configurations.

According to the above-described configurations, a display device of the invention is an EL display device having a means for performing gray scale display by using a subframe.

Electronic equipments of the present invention are provided with a display device with the above-described configurations.

As described above, according to a memory circuit of the invention, the driving amplitude of a word line is varied from the signal amplitudes of an X decoder and a memory cell so that writing failure and reading failure of the memory cell can be reduced without making the size thereof large. Furthermore, the driving amplitude of a word line is varied between when writing and reading so that the power consumption can be reduced.

In an integrated display device comprising a memory circuit of the invention, the yield of a display device can be improved while the cost thereof can be reduced.

DETAILED DESCRIPTION OF THE INVENTION

Embodiment Mode 1

Figure 1:
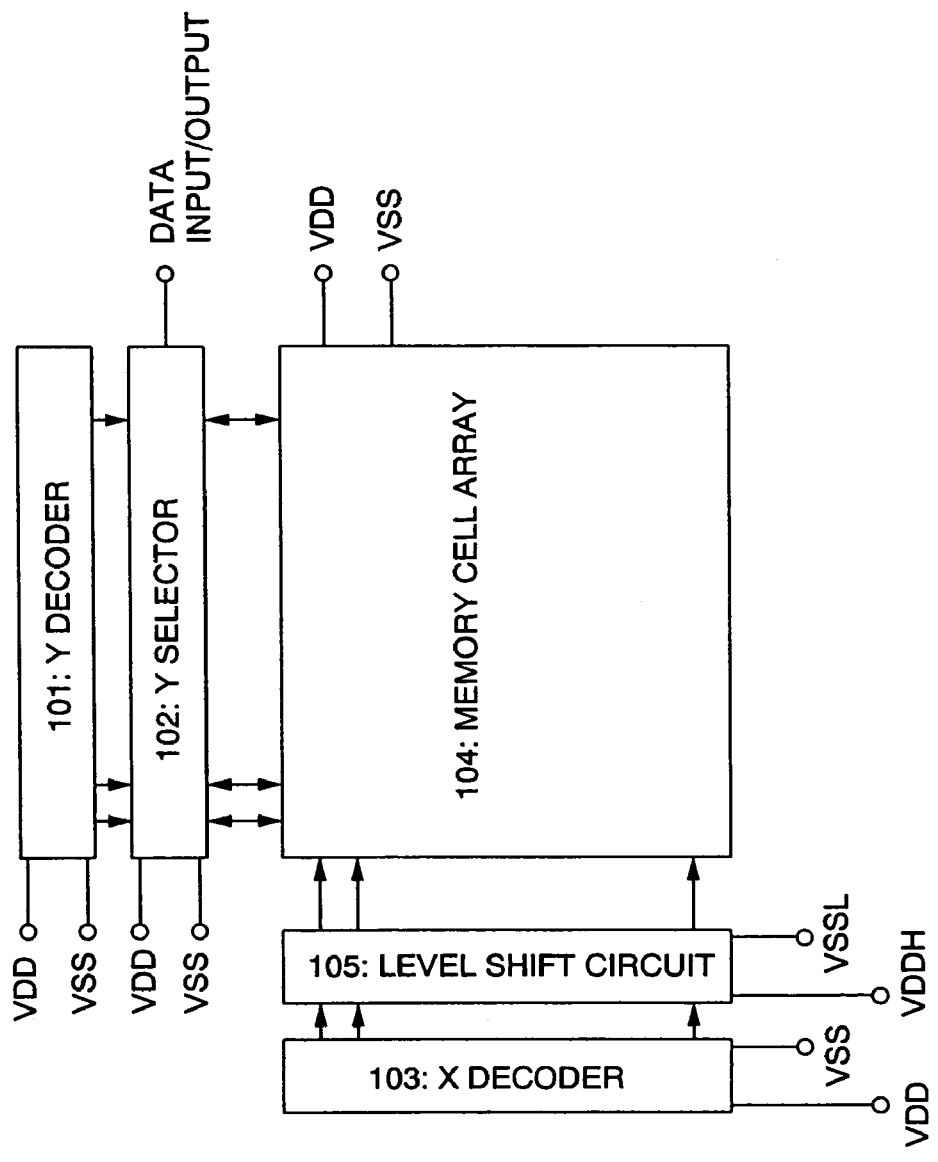
FIG. 1 is a diagram showing an embodiment mode of a memory circuit of the invention.
Figure 2:
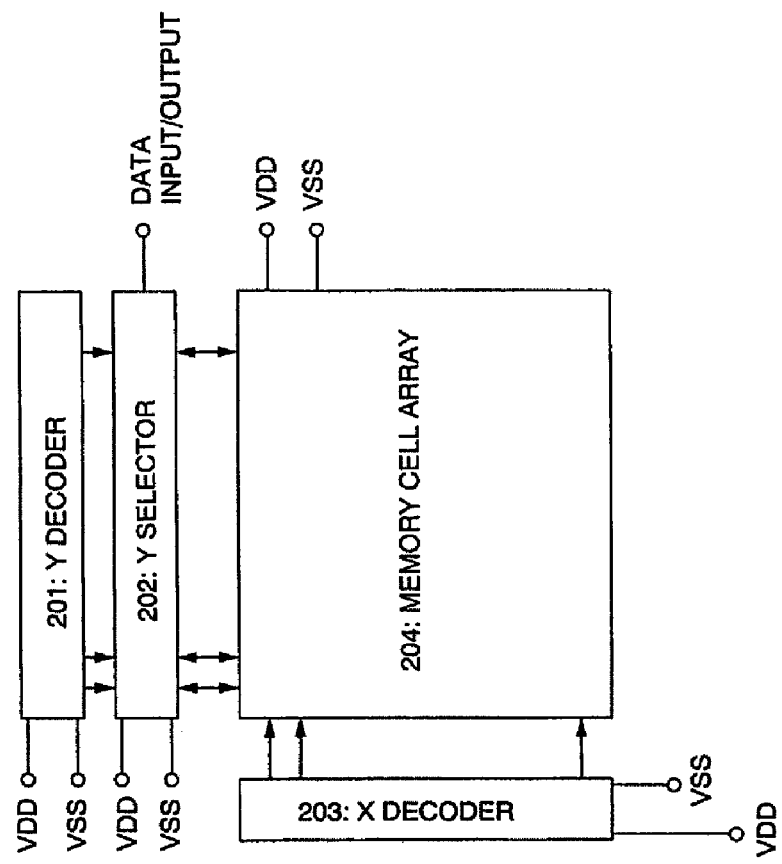
FIG. 2 is a diagram showing a conventional memory circuit.
Figure 3:
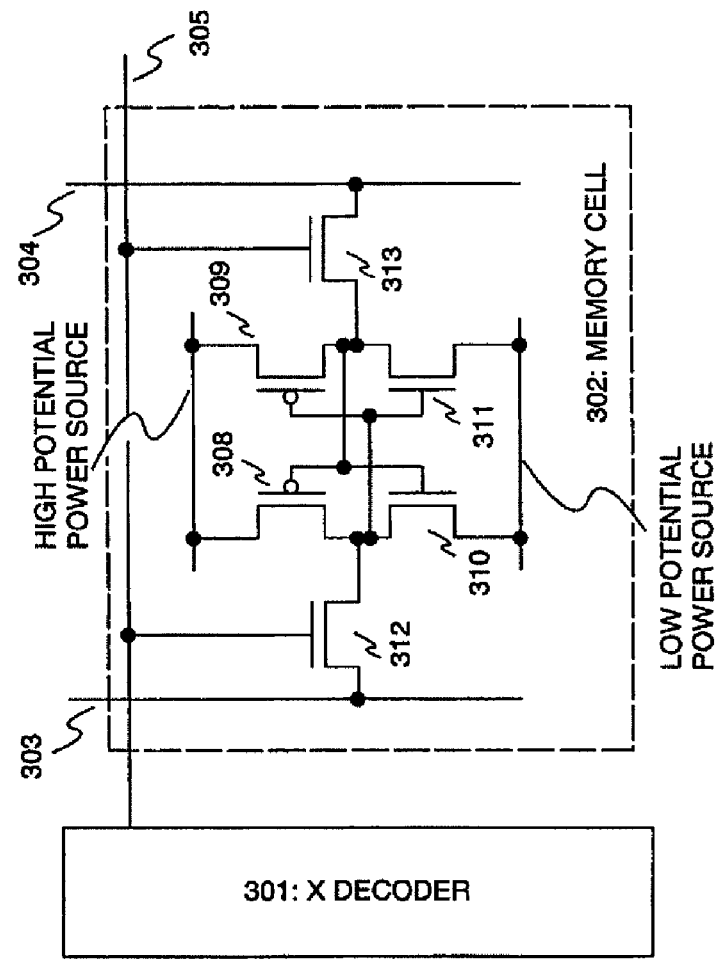
FIG. 3 is a diagram showing a conventional SRAM.
Figure 4:
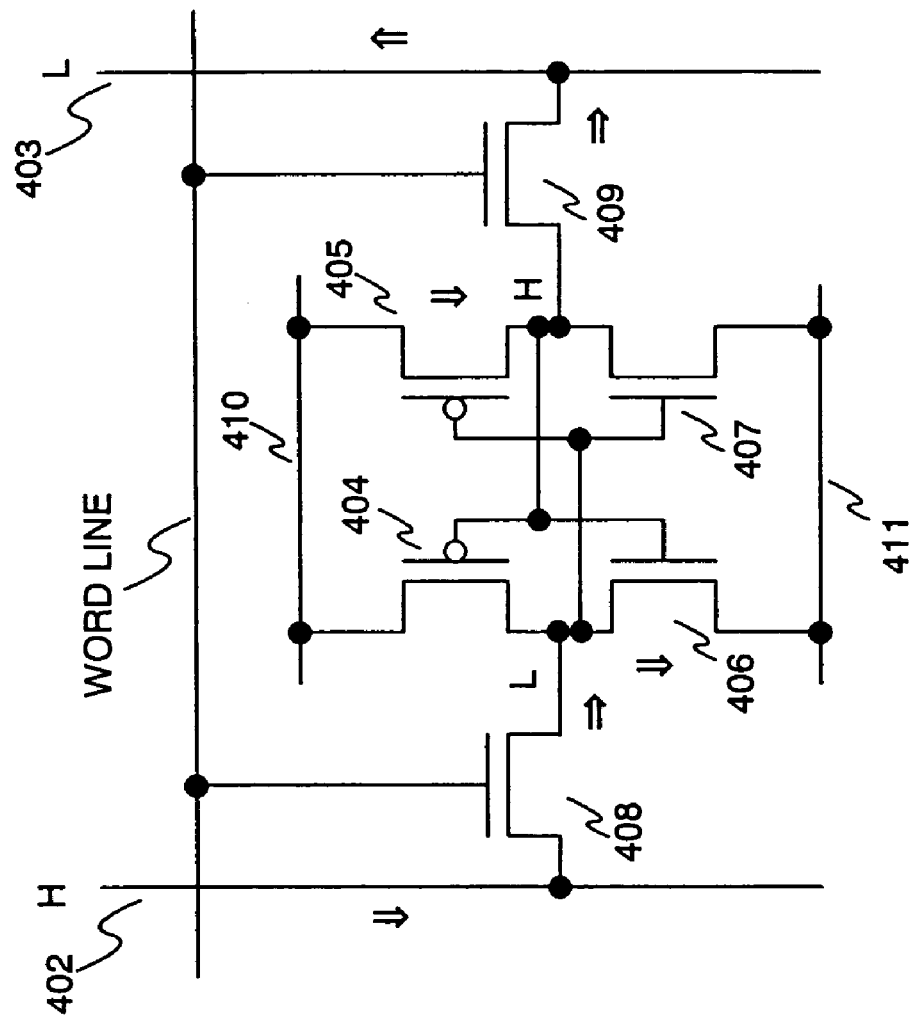
FIG. 4 is a diagram showing a memory cell of an SRAM.

FIG. 1 is a diagram showing an embodiment mode of the invention. As shown in FIG. 1, the embodiment mode of the invention comprises a Y decoder 101, a Y selector 102, an X decoder 103, a memory cell array 104, and a level shift circuit 105. The X decoder 103 and the level shift circuit 105 constitute a word line driver circuit. The level shift circuit 105 which outputs the different output amplitude than the output amplitude of the memory cell array 104 and the X decoder 103 is additionally provided to a conventional memory circuit. The output signal of the X decoder 103 is inputted to the memory cell array 104 after being varied the amplitude by the level shift circuit 105. To the X decoder 103, the Y decoder 101, the Y selector 102, and the memory cell array 104, power sources are supplied from a high potential power source VDD and a low potential power source VSS as in the conventional circuit. Another power source system, that is, a high potential power source VDDH and a low potential power source VDDL, are provided to the level shift circuit 105 so that the level shift circuit 105 has a different output amplitude of the X decoder 103, the Y decoder 101, the Y selector 102, and the memory cell array 104. Consequently, a word line in the memory cell array 104 can be driven either by a signal having a higher potential than the high potential power source of the memory cell or by a signal having a lower potential than the low potential power source of the memory cell. In addition, the word line can be driven either by a signal having a lower potential than the high potential power source of the memory cell or by a signal having a higher potential than the low potential power source of the memory cell. In other words, writing failure of a memory circuit can be reduced by driving a word line by the larger amplitude than the signal amplitude of a memory cell while reading failure of the memory circuit can be reduced by driving the word line by the smaller amplitude than the signal amplitude of the memory cell.

By driving a word line by a signal having the higher potential than a high potential power source of a memory cell, a gate of a switching transistor in the memory cell can be driven at the high potential. In the case of an N-type switching transistor in the memory cell, the current capability of the switching transistor can be increased without increase in the gate width thereof. Therefore, the operation failure in writing can be eliminated.

By driving the word line by a signal having the lower potential than the high potential power source of the memory cell, the gate of the switching transistor in the memory cell can be driven at the low potential. In the case of an N-type switching transistor in the memory cell, the current capability of the switching transistor can be decreased. Therefore, the operation failure in reading can be eliminated.

By driving the word line by a signal having the lower potential than a low potential power source of the memory cell, the gate of the switching transistor in the memory cell can be driven at the low potential. In the case of a P-type switching transistor in the memory cell, the current capability of the switching transistor can be increased without increase in the gate width thereof. Therefore, the operation failure in writing can be eliminated.

By driving the word line by a signal having the higher potential than the low potential power source of the memory cell, the gate of the switching transistor in the memory cell can be driven at the high potential. In the case of a P-type switching transistor in the memory cell, the current capability of the switching transistor can be decreased. Therefore, the operation failure in reading can be eliminated.

The countermeasures against a writing failure and a reading failure shown above may be performed either simultaneously or separately. In the case where only the countermeasure against a writing failure is performed, the signal amplitude of a memory cell and the signal amplitude of a level shift circuit may be equal to each other in reading. In the case where only the countermeasure against a reading failure is performed, the signal amplitude of a memory cell and the signal amplitude of a level shift circuit may be equal to each other in writing.

Embodiment Mode 2

Figure 7:
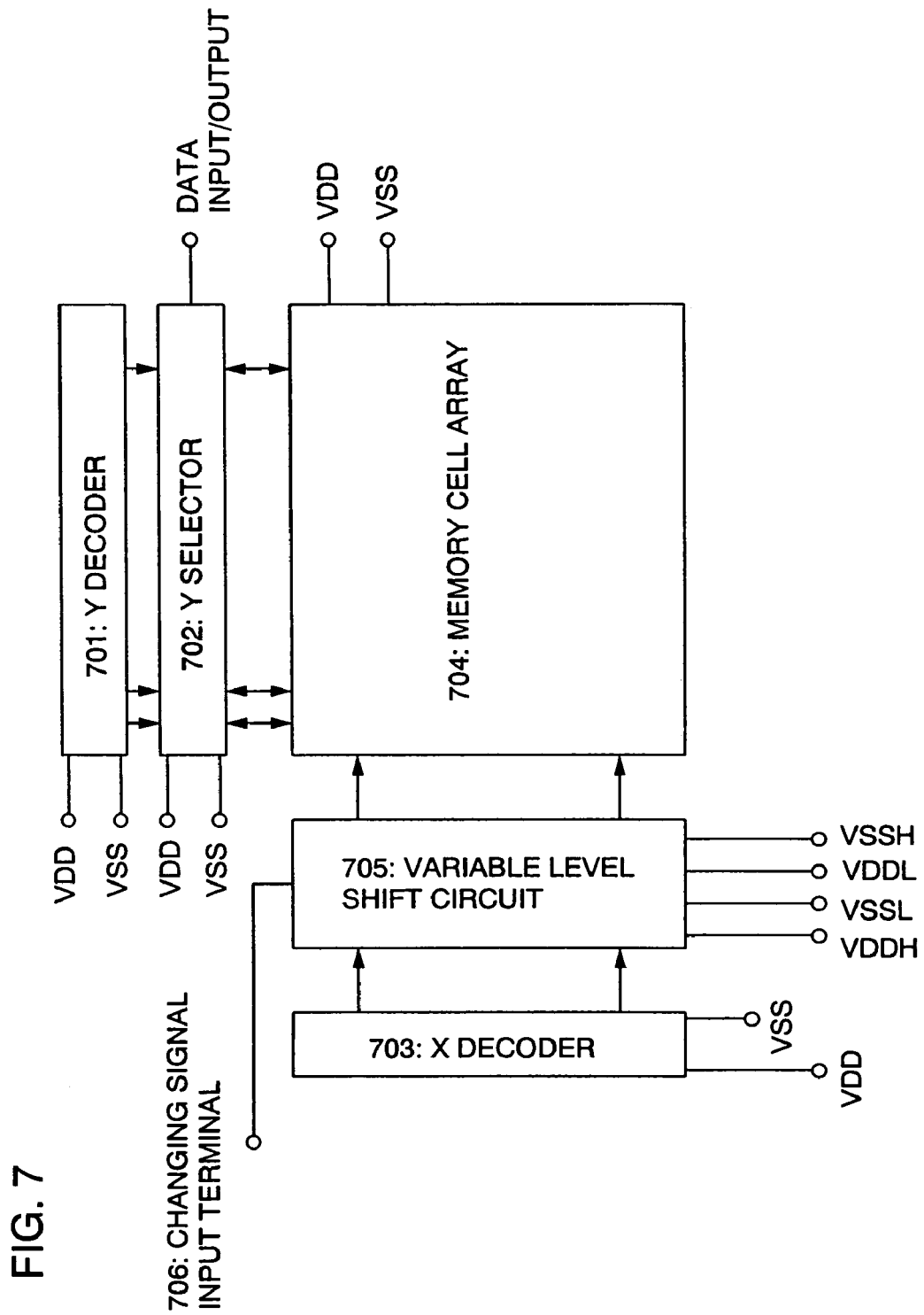
FIG. 7 is a diagram showing an embodiment mode of a memory circuit of the invention.

FIG. 7 shows the second embodiment mode of the invention. In FIG. 7, a memory circuit of this embodiment mode comprises a Y decoder 701, a Y selector 702, an X decoder 703, a memory cell array 704, and a variable level shift circuit 705. A changing signal is inputted from a changing signal input terminal 706 to the variable level shift circuit 705. The variable level shift circuit 705 has a means for outputting the output signal having the amplitude corresponding to the changing signal. The means allows the output amplitude to be optimized as needed. The output amplitude can be varied between in writing and reading.

That is, a word line is driven by the larger amplitude than the output amplitude of a memory cell when writing and the word line is driven by the smaller amplitude than the output amplitude of the memory cell when reading so that the writing failure and the reading failure which have been a problem can be reduced. Furthermore, the word line is driven by the necessary amplitude according to each condition so as to prevent the increase in power consumption due to the word line driving by the excessive large amplitude.

Figure 8:
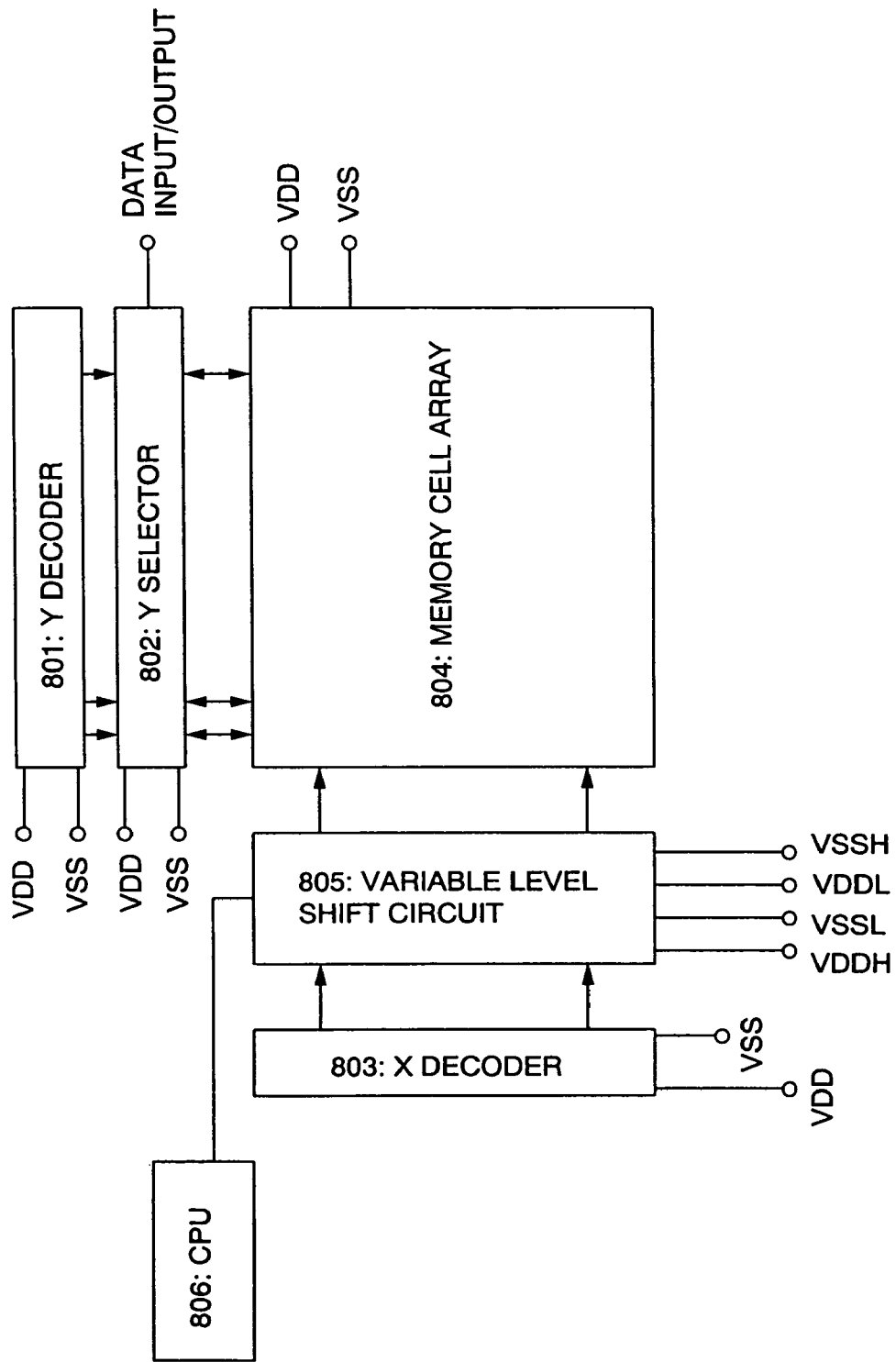
FIG. 8 is a diagram showing an embodiment mode of a memory circuit of the invention.

In FIG. 8, the variable level shift circuit shown in FIG. 7 is controlled by a CPU 806. A Y decoder 801, a Y selector 802, an X decoder 803, a memory cell array 804, and a variable level shift circuit 805 correspond to the Y decoder 701, the Y selector 702, the X decoder 703, the memory cell array 704, and the variable level shift circuit 705, respectively. The mode of a memory is controlled by the CPU 806 and by software so that speed of the response of a memory cell can be varied as needed.

Embodiment 1

Figure 5:
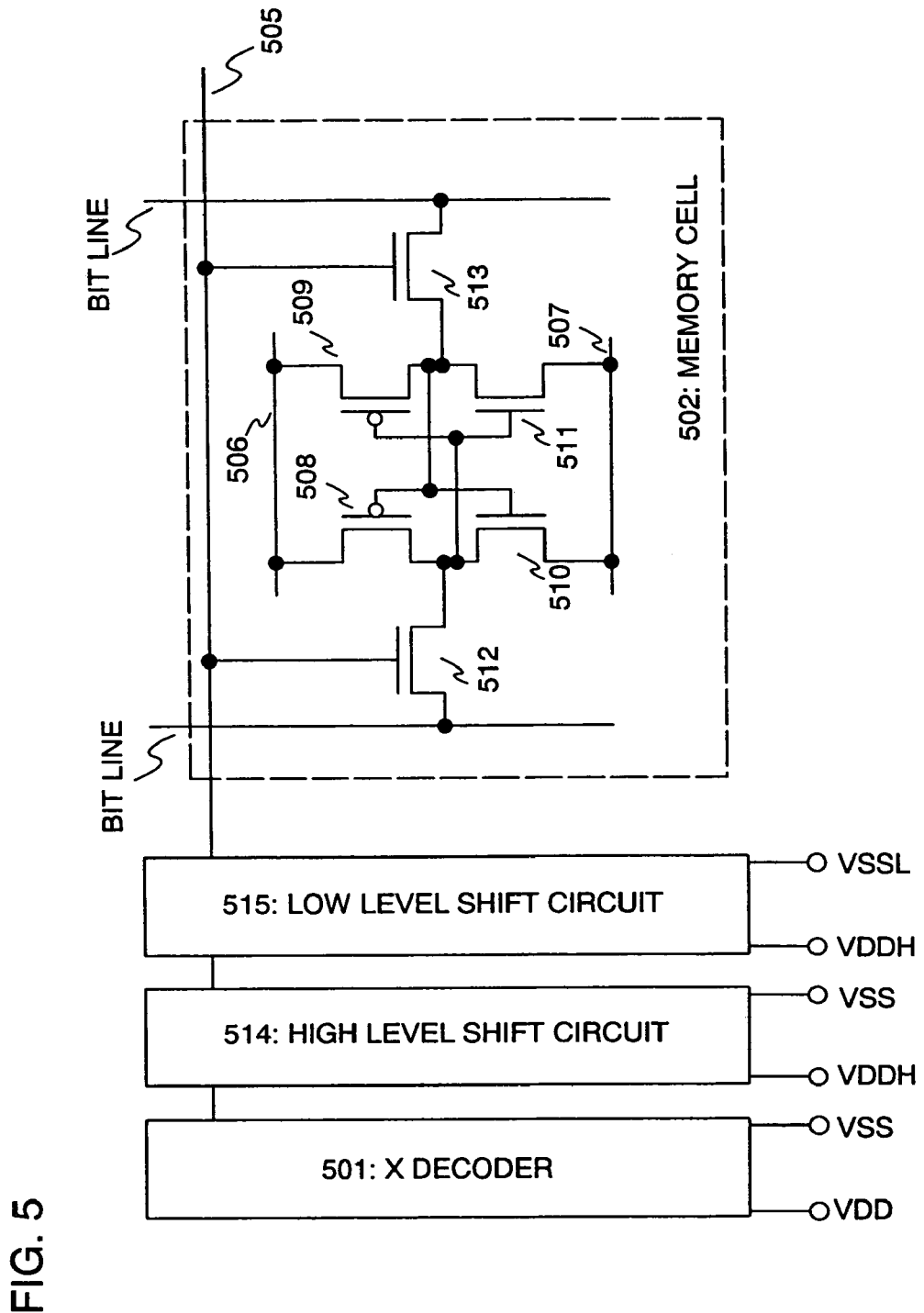
FIG. 5 is a diagram showing an embodiment of a memory circuit of the invention.

FIG. 5 shows the first embodiment of the invention. In this embodiment, the signal amplitude of the output of an X decoder 501 is amplified by using two level shifters, a high level shift circuit 514 and a low level shift circuit 515, so that a word line 505 of an SRAM memory cell 502 is driven. A high potential power source VDD and a low potential power source VSS are applied to the X decoder 501, a high potential power source VDDH and the low potential power source VSS are applied to the high level shift circuit 514, and the high potential power source VDDH and a low potential power source VSSL are applied to the low level shift circuit 515. The high potential power source VDD and the low potential power source VSS are applied to the memory cell 502. It is satisfied here that VDD≦VDDH and VSS≧VSSL.

Applied to gate electrodes of switching transistors 512 and 513 are a larger signal voltage than a high potential power source 506 and a low potential power source 507 of a pair of inverters configured with TFTs 508 to 511. Therefore, the current capability of the switching transistors 512 and 513 can be made larger than that of the pair of inverters. In this manner, the current capability of the switching transistors 512 and 513 can be increased without making the size thereof large according to this embodiment. It serves as a countermeasure against the writing failure of a memory circuit due to variations in TFTs.

A level shift circuit is configured with the high level shift circuit and the low level shift circuit according to this embodiment, however, the invention is not limited to this. In addition, the low level shift circuit is not necessarily provided in the case of an N-type switching transistor and the high level shift circuit is not necessarily provided in the case of a P-type switching transistor.

Embodiment 2

Figure 17:
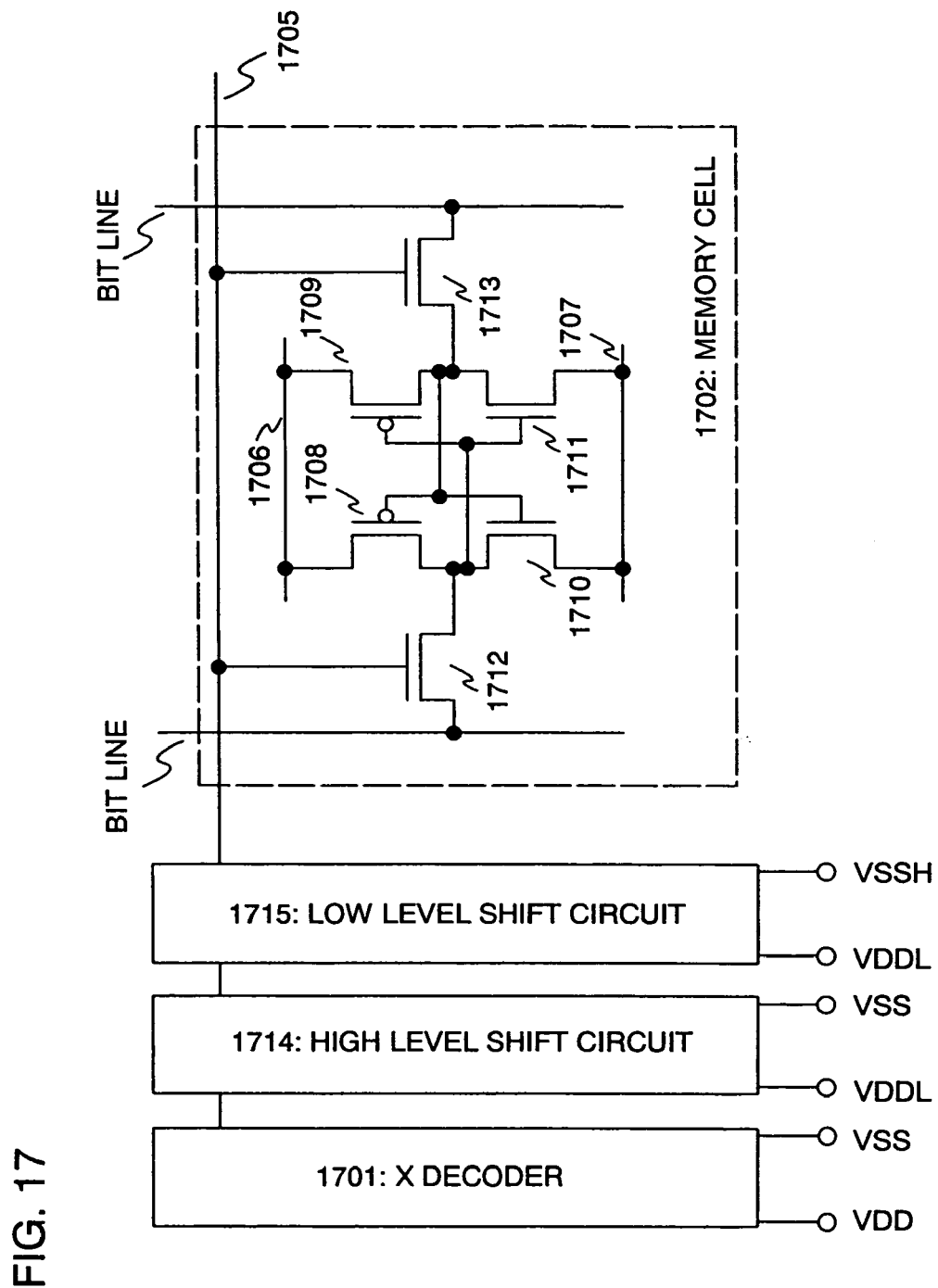
FIG. 17 is a diagram showing an embodiment of a memory circuit of the invention.

FIG. 17 shows the second embodiment of the invention. In this embodiment, as shown in FIG. 17, the signal amplitude of the output of an X decoder 1701 is reduced by using two level shifters, a high level shift circuit 1714 and a low level shift circuit 1715, so that a word line 1705 of an SRAM memory cell 1702 is driven. A high potential power source VDD and a low potential power source VSS are applied to the X decoder 1701, a high potential power source VDDL and the low potential power source VSS are applied to the high level shift circuit 1714, and the high potential power source VDDL and a low potential power source VSSH are applied to the low level shift circuit 1715. The high potential power source VDD and the low potential power source VSS are applied to the memory cell 1702. It is satisfied here that VDD≧VDDL and VSS≦VSSH.

Applied to gate electrodes of switching transistors 1712 and 1713 are a smaller signal voltage than a high potential power source 1706 and a low potential power source 1707 of a pair of inverters configured with TFTs 1708 to 1711. Therefore, the current capability of the switching transistors 1712 and 1713 can be made smaller than that of the pair of inverters. In this manner, the current capability of the switching transistors 1712 and 1713 can be decreased without making the size thereof large according to this embodiment. It serves as a countermeasure against the reading failure of a memory circuit due to variations in TFTs.

A level shift circuit is configured with the high level shift circuit and the low level shift circuit according to this embodiment, however, the invention is not limited to this. In addition, the low level shift circuit is not necessarily provided in the case of an N-type switching transistor and the high level shift circuit is not necessarily provided in the case of a P-type switching transistor.

Embodiment 3

Figure 6:
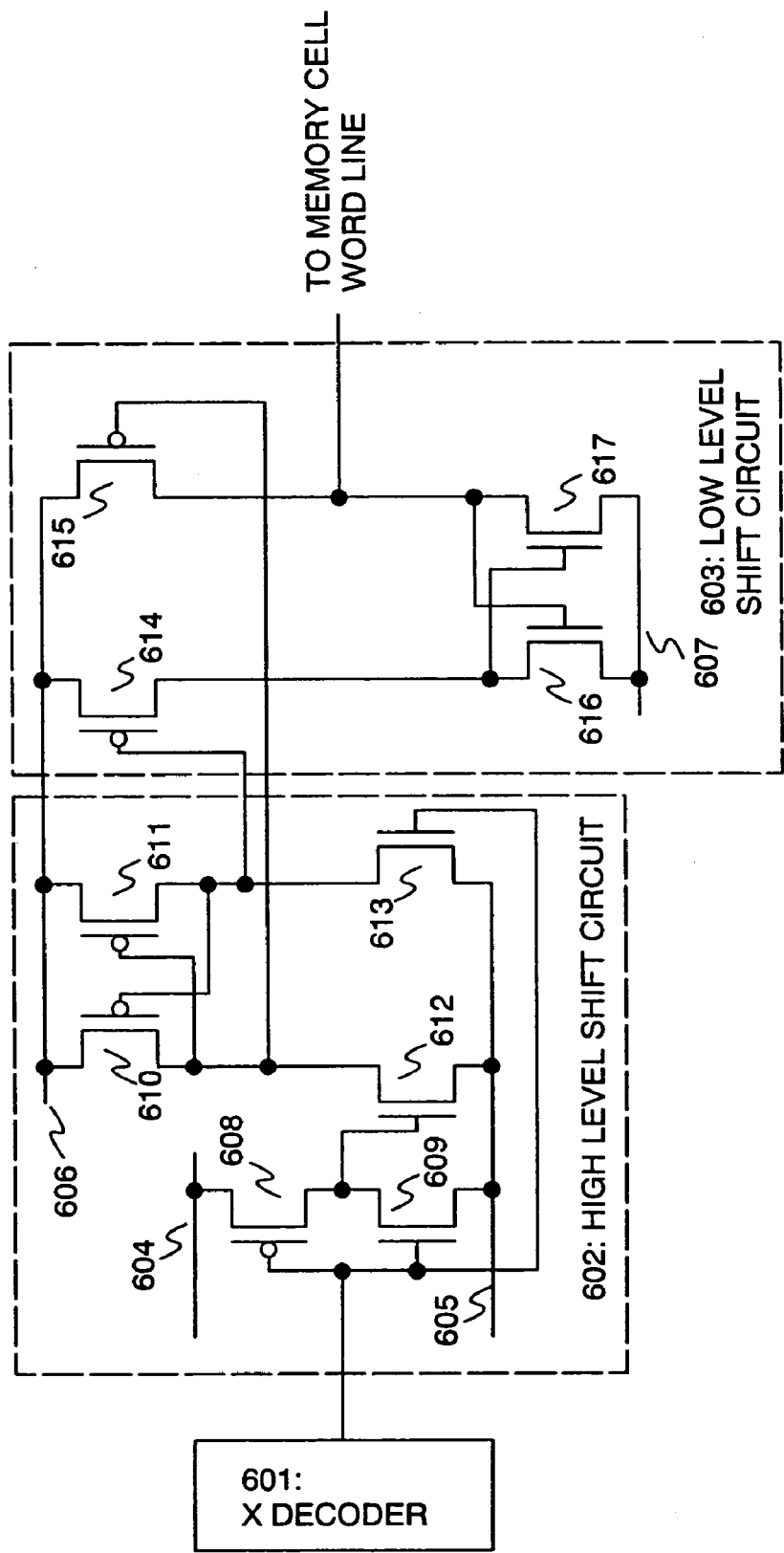
FIG. 6 is a diagram showing an embodiment of a memory circuit of the invention.

FIG. 6 shows an embodiment of a level shift circuit. In this embodiment, the high level shift circuit and the low level shift circuit which are described in Embodiment 1 are shown in detail. The output of an X decoder 601 is inputted to a high level shift circuit 602 configured with TFTs 608 to 613. First, the output of the X decoder 601 is inverted by an inverter configured with the TFTs 608 and 609. A high potential power source 604 and a low potential power source 605 of this inverter are the same as those of the X decoder 601, therefore, the signal amplitude of this inverter is equal to the output amplitude of the X decoder 601. Then, the output of the X decoder 601 and the output of the inverter are inputted to gates of the TFTs 613 and 612, respectively.

A drain of the TFT 613 is connected to a gate of the TFT 610 and a drain of the TFT 611 respectively. A drain of the TFT 612 is connected to a gate of the TFT 611 and a drain of the TFT 610. The phases of signals inputted to gates of the TFTs 613 and 612 are opposite each other. Thus, when the TFT 613 is turned ON, the TFT 610 is turned ON and the TFT 611 is turned OFF. The TFT 612 is OFF at this time. Consequently, the drain potential of the TFT 611 becomes equal to the low potential power source 605 and the drain potential of the TFT 610 becomes equal to the high potential power source 606. By setting the high potential power source 606 higher than the high potential power source 604, a high level shift can be performed.

Drains of the TFTs 610 and 611 are connected to gates of the TFTs 615 and 614 respectively. A drain of the TFT 615 is connected to a gate of a TFT 616 and a drain of a TFT 617. A drain of the TFT 614 is connected to a gate of the TFT 617 and a drain of the TFT 616. The phases of signals inputted to the gates of the TFTs 615 and 614 are opposite each other. Thus, when the TFT 615 is turned ON, the TFT 616 is turned ON and the TFT 617 is turned OFF. The TFT 614 is OFF at this time. Consequently, the drain potential of the TFT 615 becomes equal to the high potential power source 606 and the drain potential of the TFT 614 becomes equal to the low potential power source 607. By setting the low potential power source 607 lower than the low potential power source 605, a low level shift can be performed. A drain of the TFT 615 is connected to a word line of a memory cell to drive the memory cell.

A level shift circuit of the invention is not limited to that shown in this embodiment and a level shift circuit with another configuration can be used as well.

Embodiment 4

Figure 9:
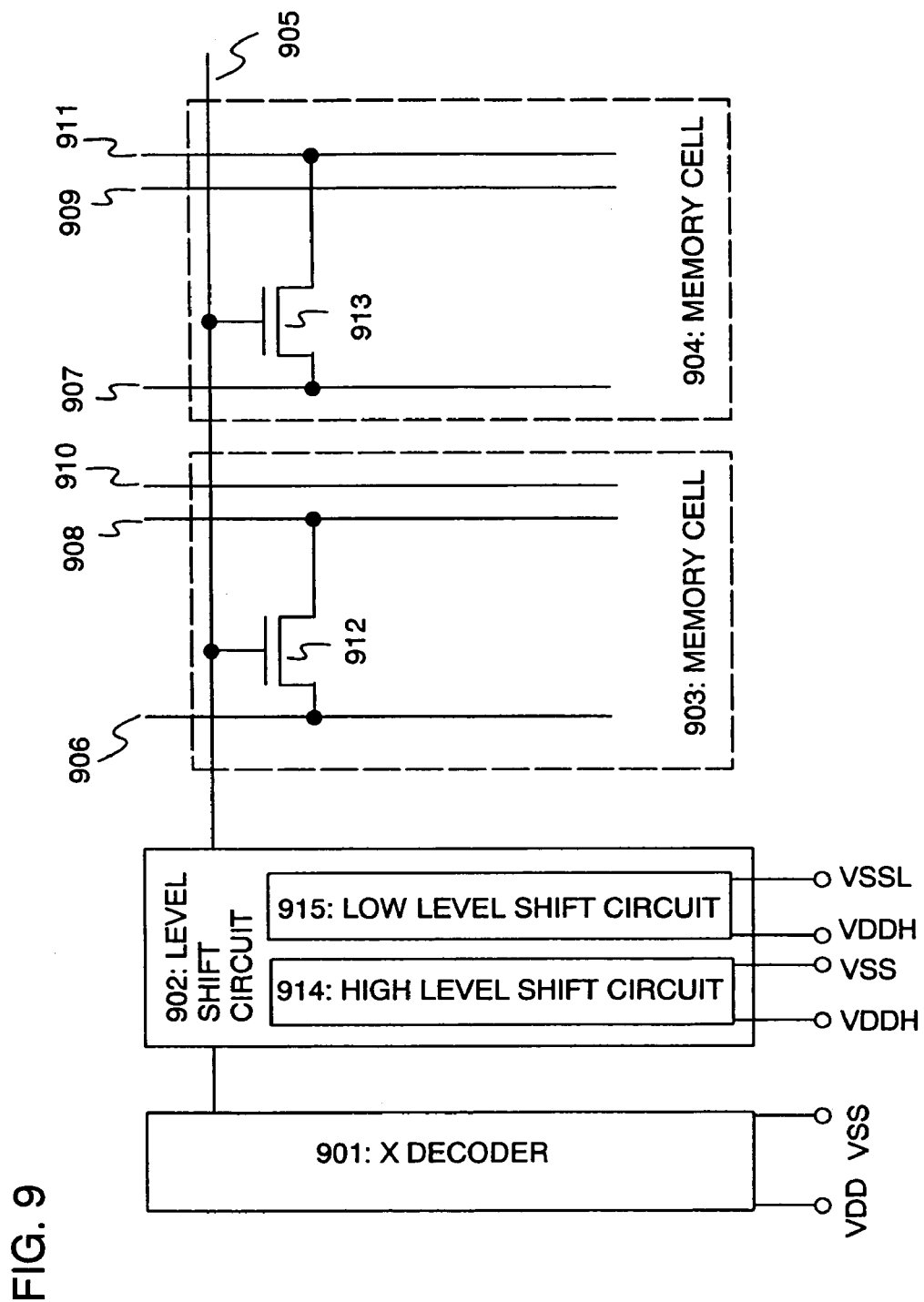
FIG. 9 is a diagram showing an embodiment of a mask ROM to which the invention is applied.

FIG. 9 shows an embodiment of a mask ROM using the invention. The mask ROM of FIG. 9 comprises memory cells 903 and 904 which are configured with switching TFTs 912 and 913, high potential wirings 908 and 909, low potential wirings 910 and 911, and bit lines 906 and 907 respectively. An X decoder 901 is the known one and a level shift circuit 902 is either the one described in Embodiment 2 or the known one. A high potential power source and a low potential power source of the X decoder 901 are indicated as a VDD and a VSS respectively, and a high potential power source and a low potential power source of the level shift circuit 902 are indicated as a VDDH and a VSSL respectively. The high potential wirings 908 and 909 are connected to the VDD, and the low potential wirings 910 and 911 are connected to the VSS. A low level shift circuit 915 is not necessarily provided in the case of N-type switching TFTs 912 and 913 and a high level shift circuit 914 is not necessarily provided in the case of P-type switching TFTs 912 and 913.

Operation thereof with N-type switching TFTs is explained below. When the output of the X decoder 901 becomes high, the output of the low level shift circuit 915 becomes high accordingly and a word line 905 is driven. Either a source or a drain of the switching TFT 912 is connected to the bit line 906 and the other is connected to the high potential wiring 908. When the switching TFT 912 is turned ON, the potential of the bit line 906 rises to the potential of the high potential wiring 908, that is the VDD. On the other hand, either a source or a drain of the switching TFT 913 is connected to the bit line 907 and the other is connected to the low potential wiring 911. When the switching TFT 913 is turned ON, the potential of the bit line 907 drops to the potential of the low potential wiring 911, that is the VSS.

In the case where the level shift circuit 902 is not provided, the potential of the word line 905 rises to the VDD at most. Therefore, in a memory cell where a switching TFT is connected to a high potential wiring like the memory cell 903, the potential of a bit line raises at most to a potential lower than the VDD by a threshold value of the switching TFT. The potential difference between the bit line and a low potential wiring is small in this case, thus a stored value may not be taken accurately and a longer time may be required to complete the potential increase of the bit line. According to the invention, the potential of the word line can be set higher than that of the high potential wiring so that the potential of the bit line can raise to the potential of the high potential wiring by providing the level shift circuit additionally. Also, the time required to complete the potential increase of the bit line can be shortened.

Embodiment 5

Figure 10:
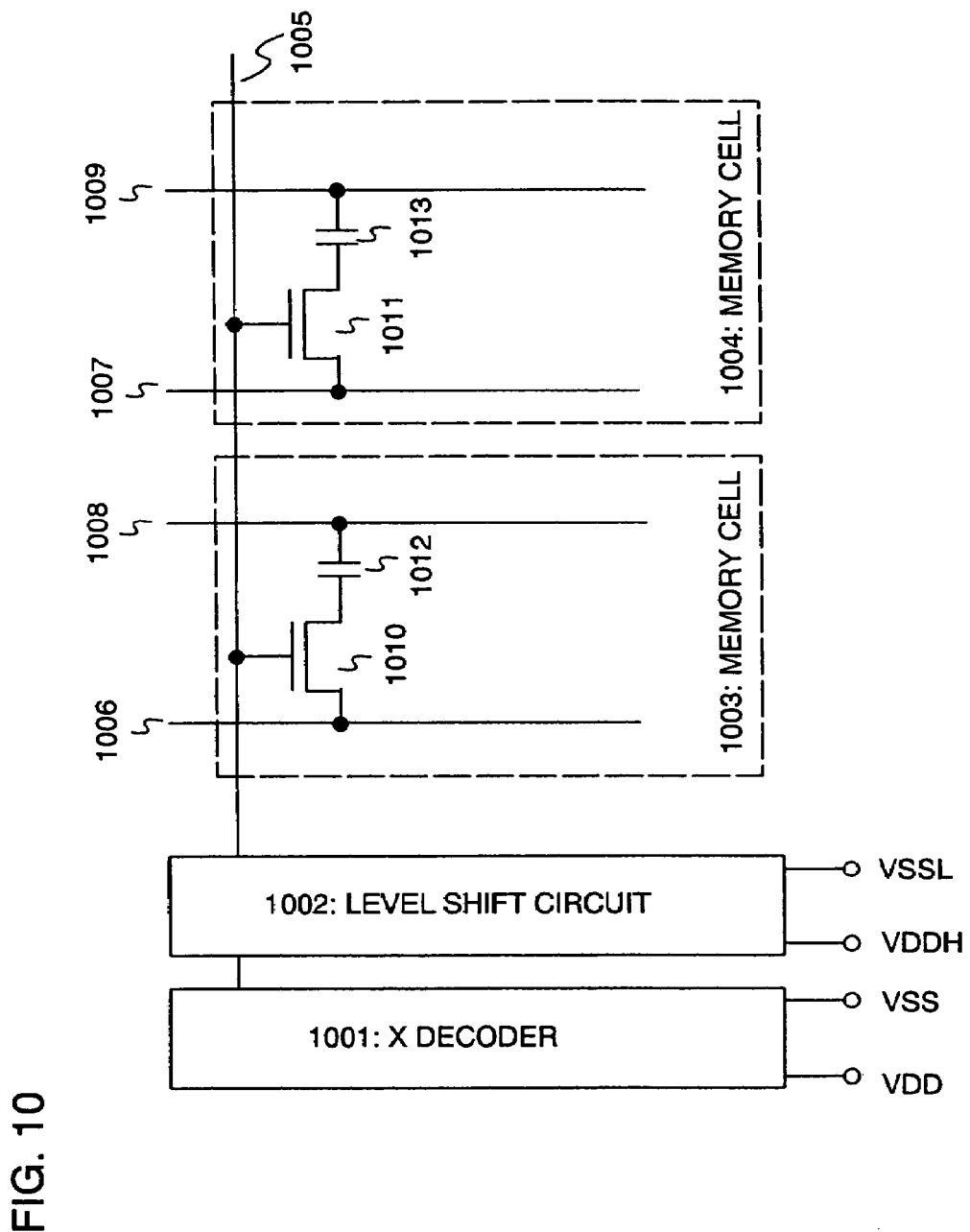
FIG. 10 is a diagram showing an embodiment of a DRAM to which the invention is applied.

FIG. 10 shows an embodiment of a DRAM using the invention. The DRAM of FIG. 10 comprises memory cells 1003 and 1004 which are configured with switching TFTs 1010 and 1011, storage capacitors 1012 and 1013, low potential wirings 1008 and 1009, and bit lines 1006 and 1007 respectively. An X decoder 1001 is the known one and a level shift circuit 1002 is either the one described in Embodiment 2 or the known one. A high potential power source and a low potential power source of the X decoder 1001 are indicated as a VDD and a VSS respectively, and a high potential power source and a low potential power source of the level shift circuit 1002 are indicated as a VDDH and a VSSL respectively.

Operation thereof with N-type switching TFTs is explained below. In a writing operation, when the output of the X decoder 1001 becomes high, the output of the level shift circuit 1002 becomes high accordingly and a word line 1005 is driven. Either a source or a drain each of the switching TFTs 1010 and 1011 is connected to the bit lines 1006 and 1007 respectively, and the other is connected to the storage capacitors 1012 and 1013 respectively. When the switching TFTs 1010 and 1011 are turned ON, data of the bit lines 1006 and 1007 are written in the storage capacitors 1012 and 1013 respectively. Subsequently, when the potential of the word line 1005 becomes low, the switching TFTs 1010 and 1011 are turned OFF and charges accumulated in the storage capacitors 1012 and 1013 are held. In a reading operation, the bit lines 1006 and 1007 are connected to a certain potential and precharged. Then, this connection is released so that the bit lines 1006 and 1007 are in a floating state. When the potential of the word line 1005 becomes high, the switching TFTs 1010 and 1011 are turned ON and the storage capacitors 1012 and 1013 discharge so that the potentials of the bit lines 1006 and 1007 are varied. This variation is detected by a sense amplifier (not shown) for the data reading.

In the case where the level shift circuit 1002 is not provided, the potential of the word line 1005 rises to the VDD at most. Therefore, the potential of a bit line in a memory cell where a switching TFT is connected to a high potential wiring like the memory cell 903, the potential of a bit line raises at most to a potential lower than the VDD by a threshold value of the switching TFT. The potential difference between the bit line and a low potential wiring is small in this case, thus, a stored value may not be taken correctly and a longer time may be required to complete the potential increase of the bit line. According to the invention, the potential of the word line can be set higher than that of the high potential wiring so that the potential of the bit line can raise to the potential of the high potential wiring by providing the level shift circuit additionally. Also, the time required to complete the potential increase of the bit line can be shortened.

Embodiment 6

Figure 11A:
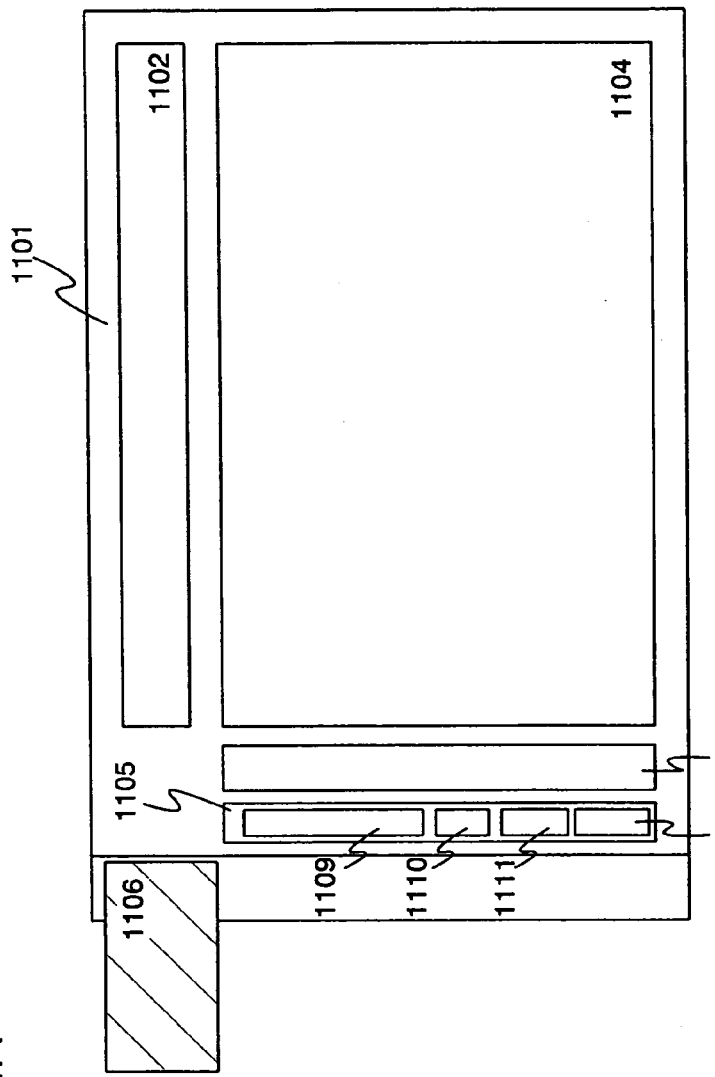
FIGS. 11A and 11B are views showing a display device in which a memory circuit of the invention is integrally formed.
Figure 11B:
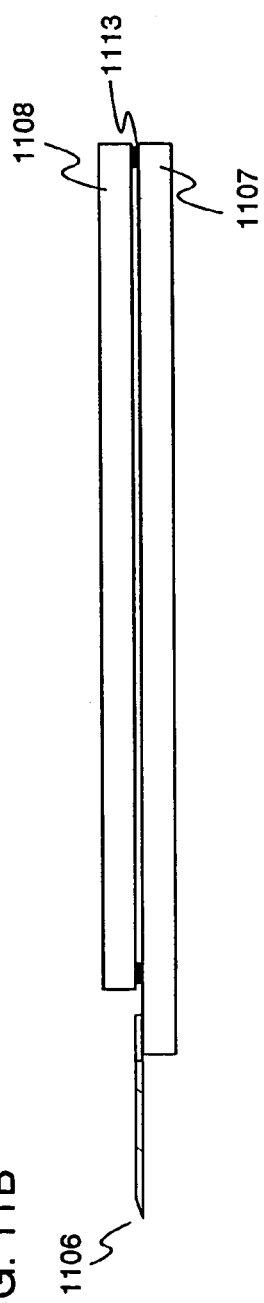

FIGS. 11A and 11B show an embodiment of a display device 1101 using a memory circuit of the present invention. In FIG. 11A, TFTs are formed on an insulating substrate 1107 and by using the TFTs, signal line driver circuits 1102 and 1103, a pixel portion 1104, and a logical circuit portion 1105 are configured. The logical circuit portion 1105 comprises a memory circuit 1109 of the invention, a CPU 1110, a controller 1111, and an image processing circuit 1112. External signals such as a clock, a power source, and the like are supplied through an FPC 1106. A counter substrate 1108 is attached to the insulating substrate 1107 and the periphery thereof is sealed by using a sealing member 1113 as shown in FIG. 11B.

A liquid crystal material, an EL (electro-luminescence) material, and an electrophoresis material can be employed as a display material. The display material is injected or formed between the insulating substrate 1107 and the counter substrate 1108 to form a display device. The display device may be formed with an insulating substrate such as glass, plastic, quartz, or the like.

In addition, the above-described memory circuit 1109 is not limited to an SRAM, a DRAM, and a mask ROM, and another memory element may be employed. Alternatively, the memory circuit 1109 may be formed by employing two or more of the SRAM, the DRAM, and the mask ROM. The CPU 1110 processes data or program stored in the memory circuit 1109 and controls the controller 1111 and the image processing circuit 1112. The controller 1111 forms a clock, a synchronizing signal, a control pulse, and the like required for the signal line driver circuits 1102 and 1103. The image processing circuit 1112 forms image data according to the instruction from the CPU 1110.

This embodiment can be used in combination with Embodiment Modes 1 and 2, or Embodiments 1 to 4.

Embodiment 7

Figure 14:
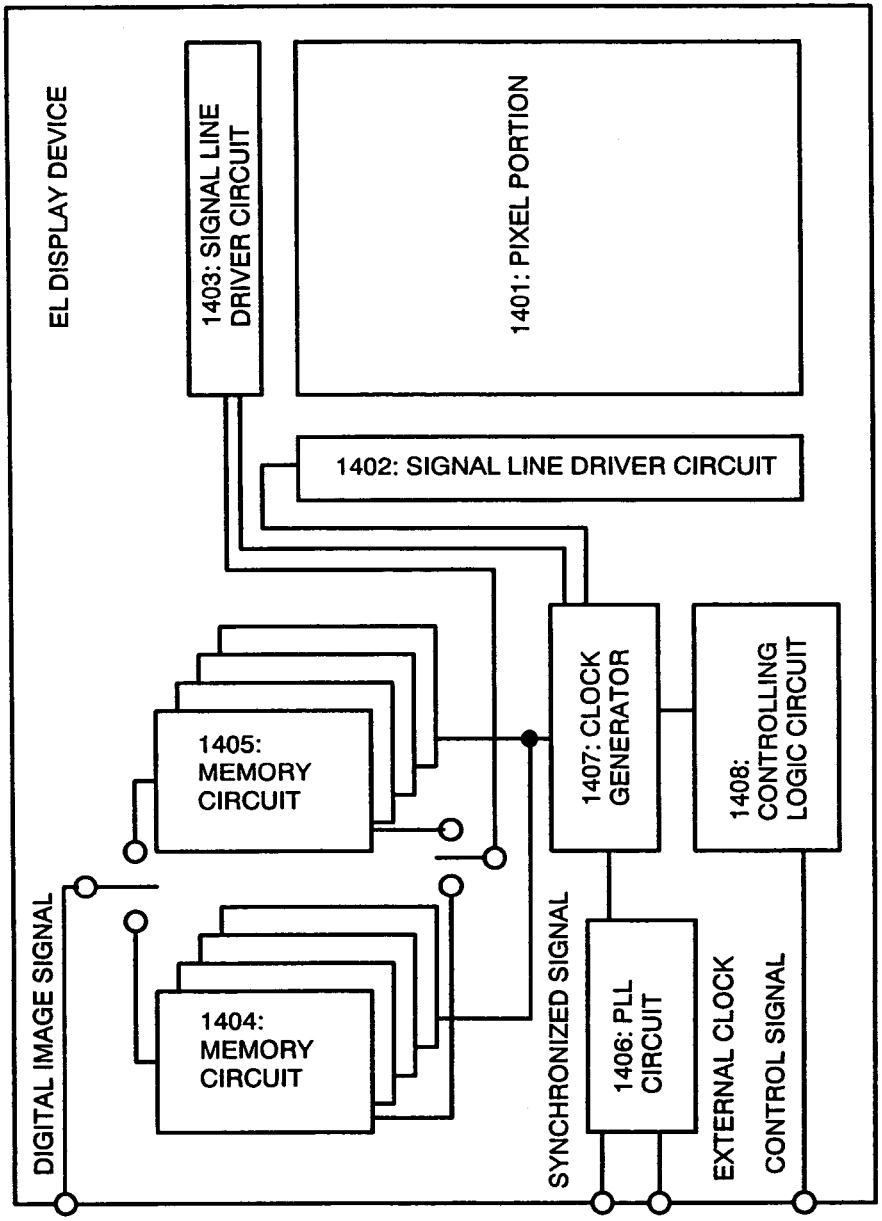
FIG. 14 is a diagram showing an EL display device in which a memory circuit of the invention is integrally formed.

FIG. 14 shows an example of an EL display device using the invention. Time gray scale method has been proposed as a method for performing gray scale display in the EL display device. In the time gray scale method, as disclosed in Japanese Patent Laid-Open No. 2001-343933, one frame period is divided into a plurality of different subframe periods and a lighting period is set to be different among pixels, so that gray scale display is performed.

In the display device using the time gray scale method, the conversion of a video signal into the one corresponding to the subframe is required. A specific method thereof is explained with reference to FIG. 14. The EL display device of FIG. 14 comprises a pixel portion 1401 including a plurality of EL pixels, signal line driver circuits 1402 and 1403 for driving a plurality of signal lines in the pixel portion 1401, memory circuits 1404 and 1405, a PLL circuit 1406 for generating a fundamental clock in synchronization with an external clock, a clock generator 1407 for supplying a clock and the like to the signal line driver circuits 1402 and 1403 and the memory circuits 1404 and 1405 in accordance with the fundamental clock, and a controlling logical circuit 1408 for controlling the clock generator 1407.

Operation thereof is explained next. First, a digital video signal for one frame is stored in the memory circuit 1404. In the case of a 4-bit video signal, for example, the 4-bit video signal is preferably stored bit by bit. A digital video signal for the subsequent frame is stored in the memory circuit 1405. While the digital video signal is stored in the memory circuit 1405, the digital video signal stored in the memory circuit 1404 is outputted to the signal line driver circuit 1403. At this time, the video signal is outputted bit by bit. That is, a video signal of the first bit is outputted completely, and then, a video signal of the second bit is outputted completely. According to the output of an image signal bit by bit, the subframe conversion can be performed.

The invention can be applied in the EL display device in which the above means is integrally formed by using TFTs. An SRAM or a DRAM is employed as each of the memory circuits 1404 and 1405. According to the invention, operation failures of the memory circuits 1404 and 1405 which are formed integrally with the pixel portion 1401 are prevented and thus the yield can be improved. It is to be noted that the display device can be integrally formed on a glass substrate, a plastic substrate, and the like.

This embodiment can be used in combination with Embodiment Modes 1 and 2, or Embodiments 1 to 4.

Embodiment 8

Figure 15:
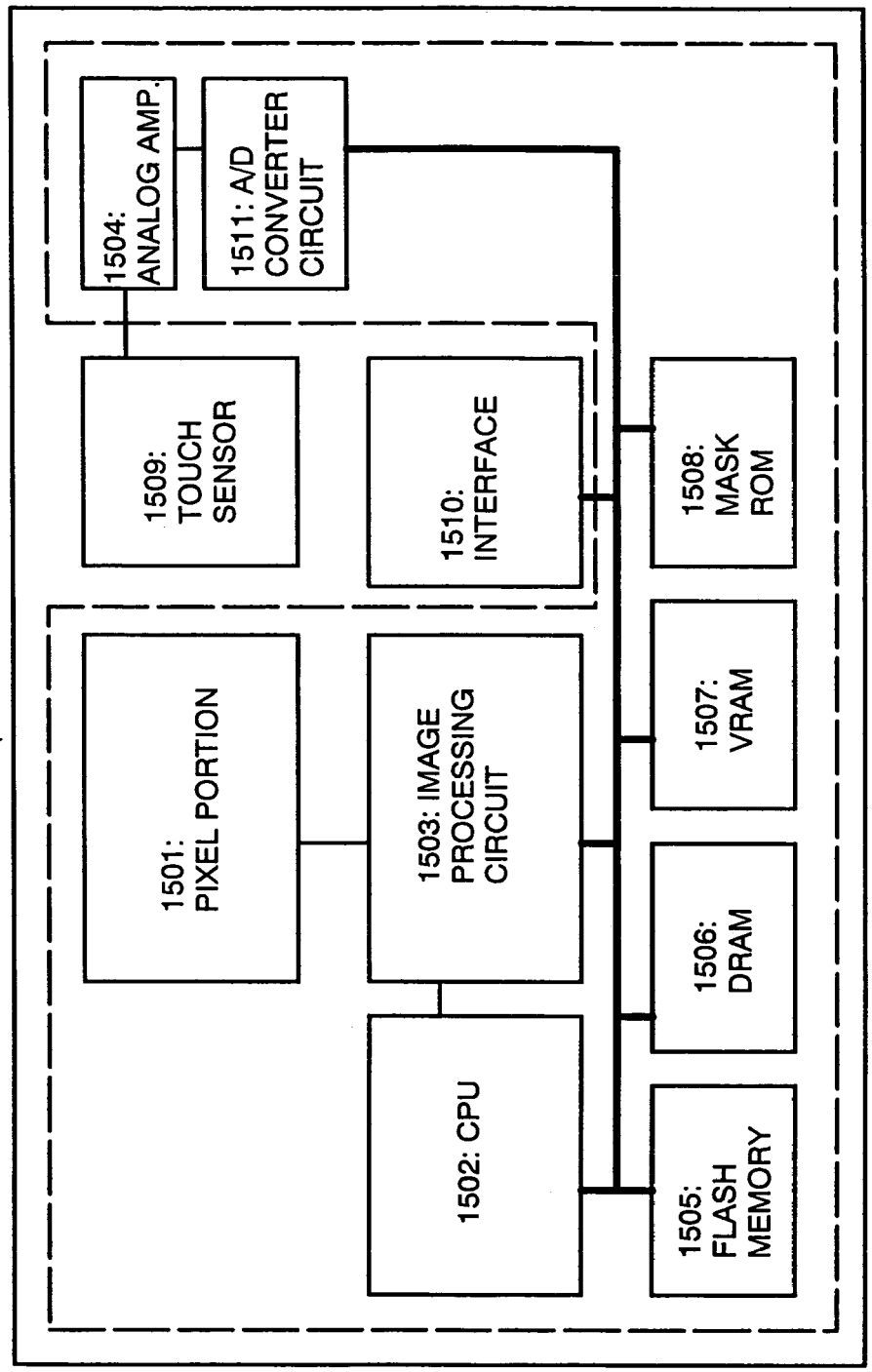
FIG. 15 is a diagram showing a PDA in which a memory circuit of the invention is integrally formed.

FIG. 15 shows an example of an integrated PDA using the invention. The integrated PDA of FIG. 15 comprises on the same substrate a pixel portion 1501, a CPU 1502, an image processing circuit 1503, an analog amplifier 1504, a flash memory 1505, a DRAM 1506, a VRAM 1507, and a mask ROM 1508. In addition, a touch sensor 1509 and a memory card interface 1510 are externally connected to the substrate. Note that an SRAM may be employed instead of the DRAM 1506.

The pixel portion 1501 displays images by using a display material such as liquid crystal, an EL (electro-luminescence), and an electrophoresis element. The CPU 1502 processes data based on data of each memory circuit, an instruction, a signal of the touch sensor 1509. The image processing circuit 1503 forms specific image data under control of the CPU 1502. The flash memory 1505 files data when a power source is OFF, and the VRAM 1507 and the DRAM 1506 file temporary data. The mask ROM 1508 files a program such as OS with no necessity to change. The touch sensor 1509 is provided for inputting data with a pen or the like by a user, and a signal of the data is transmitted to the another block through the analog amplifier 1504 and an A/D converter circuit 1511. The memory card interface 1510 interfaces when an external signal is connected or a memory card is used.

The invention can be applied to a TFT substrate on which such integrated PDA is structured. In particular, when the invention is applied to the flash memory 1505, the DRAM 1506, the VRAM 1507, and the mask ROM 1508, operation failures of the memory circuits which are formed integrally with the pixel portion 1501 are prevented and thus the yield can be improved. It is to be noted that the display device can be formed integrally on a glass substrate, a plastic substrate, and the like.

This embodiment can be used in combination with Embodiment Modes 1 and 2, or Embodiments 1 to 4.

Embodiment 9

Figure 16:
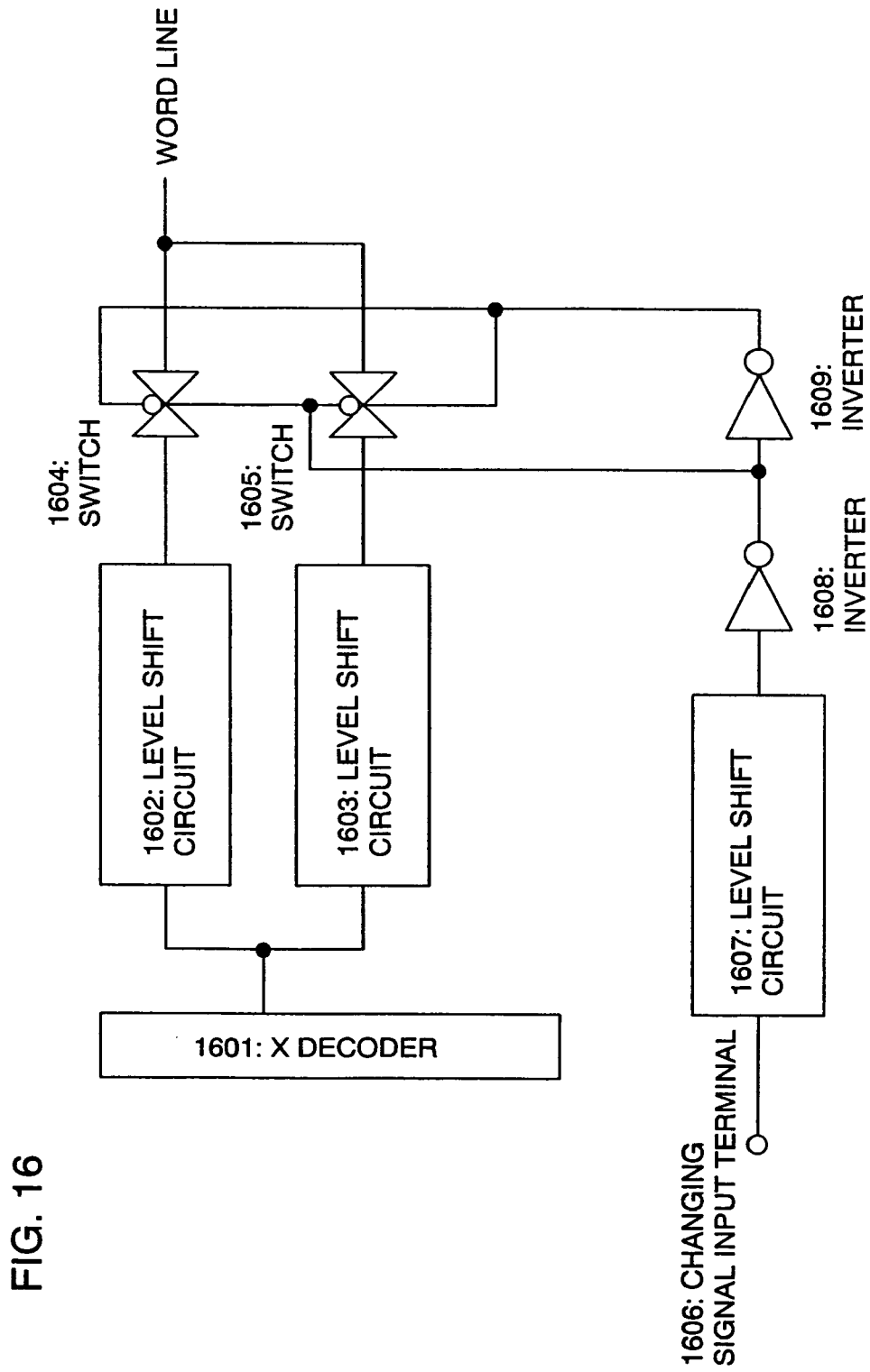
FIG. 16 is a diagram showing an embodiment of a memory circuit of the invention.

FIG. 16 shows an embodiment of a variable level shift circuit. The variable level shift circuit of FIG. 16 comprises an X decoder 1601, level shift circuits 1602, 1603 and 1607, switches 1604 and 1605, a changing signal input terminal 1606, and inverters 1608 and 1609. An output signal of the X decoder 1601 is inputted to the level shift circuits 1602 and 1603 and output with different amplitude from each other. On the other hand, a changing signal inputted to the changing signal input terminal 1606 is shifted in the level shift circuit 1607. Note that, the level shift circuit 1607 is not necessary in the case where a switching signal has a large enough amplitude. The output of the level shift circuit 1607 is inputted to the inverter 1608, and the output thereof is inputted to the inverter 1609 and each control terminal of the switches 1604 and 1605. The output of the inverter 1609 is inputted to the other control terminals of the switches 1604 and 1605.

When the output of the level shift circuit 1607 becomes high, the switch 1605 is turned ON while the switch 1604 is turned OFF. Consequently, the output of the level shift circuit 1603 is connected to a word line. When the output of the level shift circuit 1607 becomes low, the switch 1605 is turned OFF while the switch 1604 is turned ON. Consequently, the output of the level shift circuit 1602 is connected to the word line.

Known circuit may be employed as the level shift circuit here. In addition, a configuration of the variable level shift circuit is not limited to the one shown in this embodiment, and another circuit may be employed alternatively.

Embodiment 10

A display device according to the foregoing embodiments can be used as a display portion of various electronic equipment. Such electronic equipment incorporating the display device according to the invention as a display medium described below.

Examples of the electronic equipment include video cameras, digital cameras, head mounted displays (goggle type displays), game machines, car navigation systems, personal computers, portable information terminals (mobile computers, mobile phones, electronic books, etc.). Specific examples of the electronic equipment are shown in FIGS. 12A to 12G.

Figure 12A:
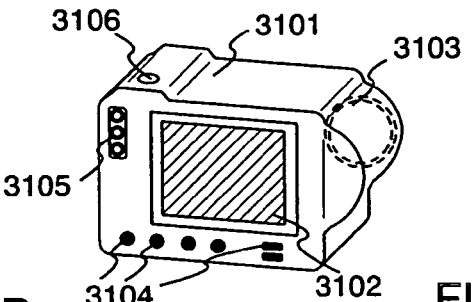
FIGS. 12A to 12G are views showing electronic equipment each using the invention.

FIG. 12A is a digital camera, which includes a body 3101, a display portion 3102, an image-receiving portion 3103, operating keys 3104, an external connection port 3105, a shutter 3106, and the like. A compact and lightweight digital camera can be obtained by using the display device of the invention in the display portion 3102.

Figure 12B:
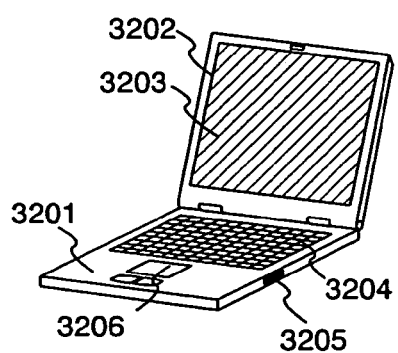

FIG. 12B is a notebook personal computer, which includes a body 3201, a housing 3202, a display portion 3203, a keyboard 3204, an external connection port 3205, a pointing mouse 3206, and the like. A compact and lightweight notebook personal computer can be obtained by using the display device of the invention in the display portion 3203.

Figure 12C:
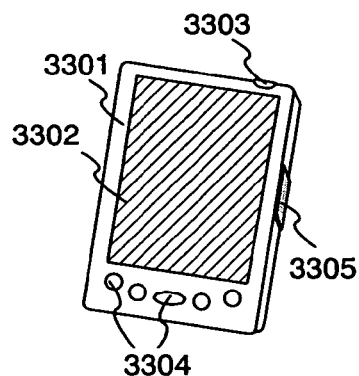

FIG. 12C is a portable information terminal, which includes a body 3301, a display portion 3302, a switch 3303, operating keys 3304, an infrared port 3305, and the like. A compact and lightweight portable information terminal can be obtained by using the display device of the invention in the display portion 3302.

Figure 12D:
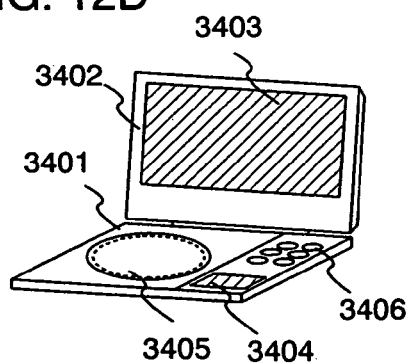

FIG. 12D is an image reproduction device provided with a recording medium (specifically, a DVD reproducing device), which includes a body 3401, a housing 3402, a recording medium (such as CD, LD, and DVD) read-in portion 3405, an operating key 3406, a display portion A 3403, a display portion B 3404, and the like. The display portion A 3403 mainly displays image data, whereas the display portion B 3404 mainly displays character data, and the display device of the invention can be used in the display portion A 3403 and in the display portion B 3404. Note that a compact and lightweight image reproduction device can be obtained by using the invention in the image reproduction devices provided with a recording medium such as CD reproduction devices and game machines.

Figure 12E:
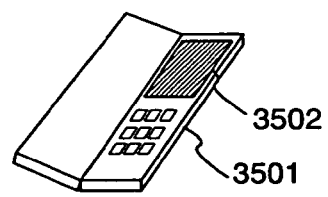

FIG. 12E is a folding portable display device. A compact and lightweight folding portable display device can be obtained by using the invention in a display portion 3502 mounted on a body 3501.

Figure 12F:
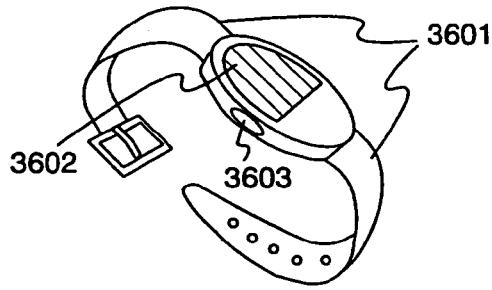

FIG. 12F is a watch type communicator, which includes a display portion 3602, bands 3601, an operation switch 3603, and the like. A compact and lightweight watch type communicator can be obtained by using the display device of the invention in the display portion 3602.

Figure 12G:
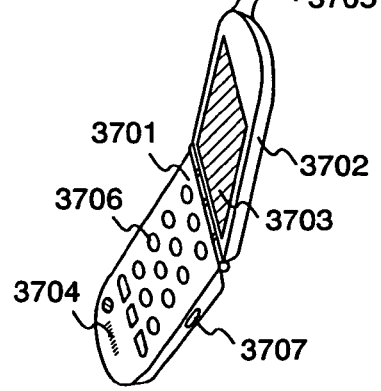
Figure 13:
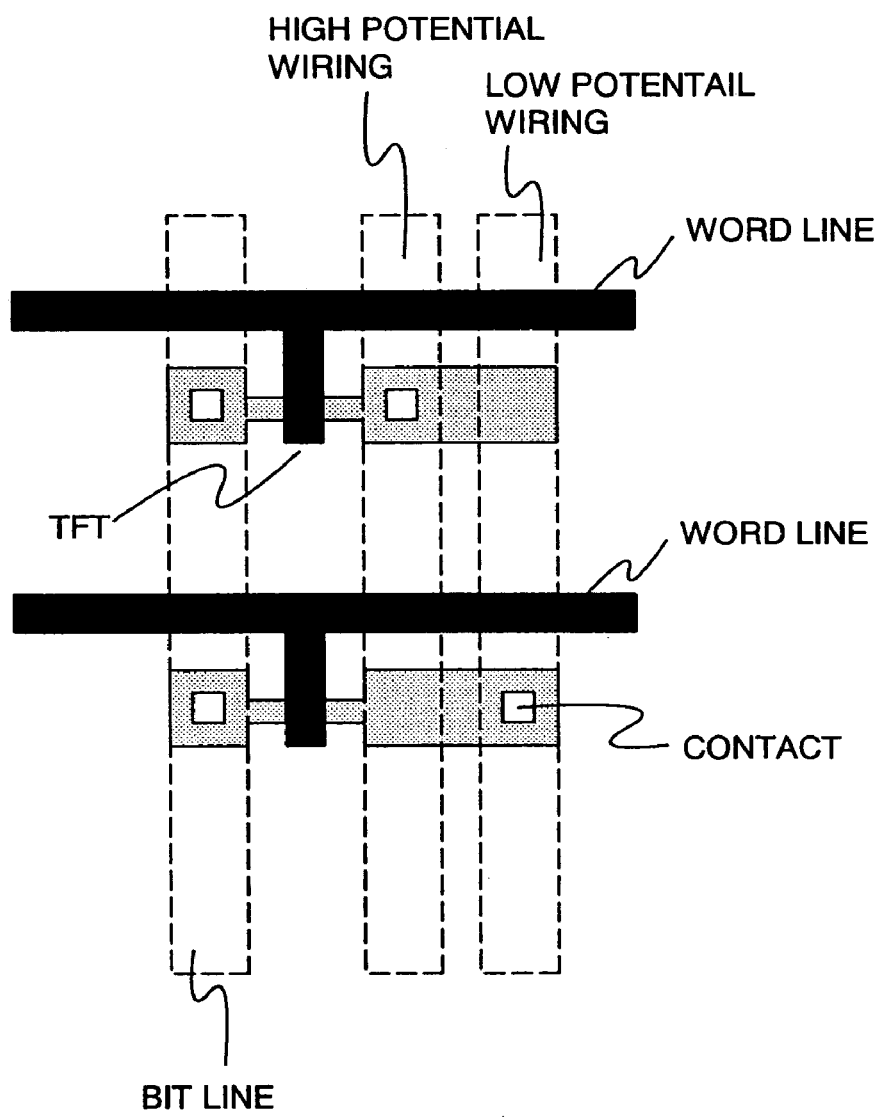
FIG. 13 is a plan view of a memory cell of a mask ROM.

FIG. 12G is a mobile phone, which includes a body 3701, a housing 3702, a display portion 3703, an audio input portion 3704, an antenna 3705, an operating key 3706, an external connecting port 3707, and the like. A compact and lightweight mobile phone can be obtained by using the display device of the invention in the display portion 3703.

As described above, an application range of the invention is so wide that the invention can be applied to electronic equipment in various fields. The electronic equipment in this embodiment can be obtained by using any combination of Embodiment Modes 1 and 2, and Embodiment 1.

This application is based on Japanese Patent Application serial no. 2003-277068 filed in Japan Patent Office on Jul. 18, 2003, the contents of which are hereby incorporated by reference.

Although the invention has been fully described by way of Embodiment Modes and with reference to the accompanying drawings, it is to be understood that various changes and modifications will be apparent to those skilled in the art. Therefore, unless such changes and modifications depart from the scope of the invention hereinafter defined, they should be constructed as being included therein.

What is claimed is:

1. An SRAM circuit comprising:
a word line, a plurality of memory cells, and a driver circuit for driving the word line,
wherein each of the plurality of memory cells includes a switching transistor having a gate which is electrically connected to the word line,
wherein the driver circuit includes a first level shift circuit configured to output a first signal to the word line and a second level shift circuit configured to output a second signal to the word line, and
wherein an amplitude of the first signal is larger than an amplitude of the second signal.

2. An SRAM circuit comprising:
a word line, a plurality of memory cells, and a driver circuit connected to the word line,
wherein each of the plurality of memory cells includes a switching transistor having a gate which is electrically connected to the word line,
wherein the driver circuit includes a first level shift circuit configured to output a first signal to the word line and a second level shift circuit configured to output a second signal to the word line, and
wherein an amplitude of the first signal is larger than an output amplitude of the memory cell.

3. An SRAM circuit comprising:
a word line, a plurality of memory cells, and a driver circuit connected to the word line,
wherein each of the plurality of memory cells includes a switching transistor having a gate which is electrically connected to the word line,
wherein the driver circuit includes a first level shift circuit configured to output a first signal to the word line and a second level shift circuit configured to output a second signal to the word line, and
wherein an amplitude of the first signal is smaller than an output amplitude of the memory cell.

4. An SRAM circuit comprising:
a word line, a plurality of memory cells, and a driver circuit connected to the word line,
wherein each of the plurality of memory cells includes a switching transistor having a gate which is electrically connected to the word line,
wherein the driver circuit includes a variable level shift circuit for changing a potential of a signal which turns on the switching transistor so that a current capability of the switching transistor is changed, and
wherein the variable level shift circuit has a first switch and a second switch for varying an output amplitude.

5. An SRAM circuit comprising:
a word line, a plurality of memory cells, and a driver circuit connected to the word line,
wherein each of the plurality of memory cells includes a switching transistor having a gate which is electrically connected to the word line,
wherein the driver circuit includes a variable level shift circuit for changing a potential of a signal which turns on the switching transistor so that a current capability of the switching transistor is changed, and
wherein the variable level shift circuit has a first switch and a second switch for varying an output amplitude when writing and reading.

6. The SRAM circuit according to claim 4, wherein an output amplitude of the variable level shift circuit is controlled by a CPU.

7. An SRAM circuit comprising:
a word line, a plurality of memory cells, and a driver circuit connected to the word line,
wherein each of the plurality of memory cells includes a switching transistor having a gate which is electrically connected to the word line,
wherein the driver circuit includes a variable level shift circuit for changing a potential of a signal which turns on the switching transistor so that a current capability of the switching transistor is changed,
wherein an output amplitude of the variable level shift circuit in writing is larger than an output amplitude in reading wherein the variable level shift circuit has a first switch and a second switch for varying the output amplitude reading.

8. The SRAM circuit according to claim 1, wherein the SRAM circuit is incorporated in a display device.

9. The SRAM circuit according to claim 8, wherein a display portion of the display device comprises a thin film transistor, and the SRAM circuit is formed integrally with the display portion.

10. The SRAM circuit according to claim 8, wherein the display device is a liquid crystal display device.

11. The SRAM circuit according to claim 8, wherein the display device is an EL display device.

12. The SRAM circuit according to claim 8, wherein the display device is an EL display device having a means for displaying gray scales by using a subframe.

13. The SRAM circuit according to claim 8, wherein the display device is incorporated in at least one selected from the group consisting of a digital camera, a personal computer, a portable information terminal, an image reproduction device, a folding portable display device, a watch type communicator, and a mobile phone.

14. The SRAM circuit according to claim 5, wherein an output amplitude of the variable level shift circuit is controlled by a CPU.

15. The SRAM circuit according to claim 2, wherein the SRAM circuit is incorporated in a display device.

16. The SRAM circuit according to claim 3, wherein the SRAM circuit is incorporated in a display device.

17. The SRAM circuit according to claim 4, wherein the SRAM circuit is incorporated in a display device.

18. The SRAM circuit according to claim 5, wherein the SRAM circuit is incorporated in a display device.

19. The SRAM circuit according to claim 7, wherein the SRAM circuit is incorporated in a display device.

20. The SRAM circuit according to claim 15, wherein a display portion of the display device comprises a thin film transistor, and the SRAM circuit is formed integrally with the display portion.

21. The SRAM circuit according to claim 16, wherein a display portion of the display device comprises a thin film transistor, and the SRAM circuit is formed integrally with the display portion.

22. The SRAM circuit according to claim 17, wherein a display portion of the display device comprises a thin film transistor, and the SRAM circuit is formed integrally with the display portion.

23. The SRAM circuit according to claim 18, wherein a display portion of the display device comprises a thin film transistor, and the SRAM circuit is formed integrally with the display portion.

24. The SRAM circuit according to claim 19, wherein a display portion of the display device comprises a thin film transistor, and the SRAM circuit is formed integrally with the display portion.

25. The SRAM circuit according to claim 15, wherein the display device is a liquid crystal display device.

26. The SRAM circuit according to claim 16, wherein the display device is a liquid crystal display device.

27. The SRAM circuit according to claim 17, wherein the display device is a liquid crystal display device.

28. The SRAM circuit according to claim 18, wherein the display device is a liquid crystal display device.

29. The SRAM circuit according to claim 19, wherein the display device is a liquid crystal display device.

30. The SRAM circuit according to claim 15, wherein the display device is an EL display device.

31. The SRAM circuit according to claim 16, wherein the display device is an EL display device.

32. The SRAM circuit according to claim 17, wherein the display device is an EL display device.

33. The SRAM circuit according to claim 18, wherein the display device is an EL display device.

34. The SRAM circuit according to claim 19, wherein the display device is an EL display device.

35. The SRAM circuit according to claim 15, wherein the display device is an EL display device having a means for displaying gray scales by using a subframe.

36. The SRAM circuit according to claim 16, wherein the display device is an EL display device having a means for displaying gray scales by using a subframe.

37. The SRAM circuit according to claim 17, wherein the display device is an EL display device having a means for displaying gray scales by using a subframe.

38. The SRAM circuit according to claim 18, wherein the display device is an EL display device having a means for displaying gray scales by using a subframe.

39. The SRAM circuit according to claim 19, wherein the display device is an EL display device having a means for displaying gray scales by using a subframe.

40. The SRAM circuit according to claim 15, wherein the display device is incorporated in at least one selected from the group consisting of a digital camera, a personal computer, a portable information terminal, an image reproduction device, a folding portable display device, a watch type communicator, and a mobile phone.

41. The SRAM circuit according to claim 16, wherein the display device is incorporated in at least one selected from the group consisting of a digital camera, a personal computer, a portable information terminal, an image reproduction device, a folding portable display device, a watch type communicator, and a mobile phone.

42. The SRAM circuit according to claim 17, wherein the display device is incorporated in at least one selected from the group consisting of a digital camera, a personal computer, a portable information terminal, an image reproduction device, a folding portable display device, a watch type communicator, and a mobile phone.

43. The SRAM circuit according to claim 18, wherein the display device is incorporated in at least one selected from the group consisting of a digital camera, a personal computer, a portable information terminal, an image reproduction device, a folding portable display device, a watch type communicator, and a mobile phone.

44. The SRAM circuit according to claim 19, wherein the display device is incorporated in at least one selected from the group consisting of a digital camera, a personal computer, a portable information terminal, an image reproduction device, a folding portable display device, a watch type communicator, and a mobile phone.

45. An SRAM circuit comprising:
a word line;
a memory cell including a switching transistor, a first inverter and a second inverter; and
a driver circuit for driving the word line and including a variable level shift circuit having an output terminal electrically connected to the word line,
wherein an input terminal of the first inverter is electrically connected to an output terminal of the second inverter, and an input terminal of the second inverter is electrically connected to an output terminal of the first inverter,
wherein a gate of the switching transistor is electrically connected to the word line, and one of a source and a drain of the switching transistor is electrically connected to the input terminal of the first inverter,
wherein the variable level shift circuit is configured to output a first signal to the word line for performing a writing operation and a second signal to the word line for performing a reading operation, an amplitude of the first signal is larger than an amplitude of the second signal, and wherein the variable level shift circuit has a first switch and a second switch for varying the output amplitude.

46. The SRAM circuit according to claim 45, wherein the SRAM circuit is incorporated in a display device.

47. The SRAM circuit according to claim 46, wherein a display portion of the display device comprises a thin film transistor, and the SRAM circuit is formed integrally with the display portion.

48. The SRAM circuit according to claim 46, wherein the display device is a liquid crystal display device.

49. The SRAM circuit according to claim 46, wherein the display device is an EL display device.

50. The SRAM circuit according to claim 46, wherein the display device is an EL display device having a means for displaying gray scales by using a subframe.

51. The SRAM circuit according to claim 46, wherein the display device is incorporated in at least one selected from the group consisting of a digital camera, a personal computer, a portable information terminal, an image reproduction device, a folding portable display device, a watch type communicator, and a mobile phone.

52. A driving method of an SRAM circuit comprising a word line, a memory cell including a switching transistor, a first inverter and a second inverter and a driver circuit for driving the word line including a variable level shift circuit, the method comprising:
   outputting a first signal from the variable level shift circuit to the word line for performing a writing operation; and
   outputting a second signal from the variable level shift circuit into the word line for performing a reading operation,
   wherein an amplitude of the first signal is larger than an amplitude of the second signal, and wherein the variable level shift circuit has a first switch and a second switch for varying the output amplitude.

53. The driving method of the SRAM circuit according to claim 52, wherein the SRAM circuit is incorporated in a display device.

54. The driving method of the SRAM circuit according to claim 53, wherein a display portion of the display device comprises a thin film transistor, and the SRAM circuit is formed integrally with the display portion.

55. The driving method of the SRAM circuit according to claim 53, wherein the display device is a liquid crystal display device.

56. The driving method of the SRAM circuit according to claim 53, wherein the display device is an EL display device.

57. The driving method of the SRAM circuit according to claim 53, wherein the display device is an EL display device having a means for displaying gray scales by using a subframe.

58. The driving method of the SRAM circuit according to claim 53, wherein the display device is incorporated in at least one selected from the group consisting of a digital camera, a personal computer, a portable information terminal, an image reproduction device, a folding portable display device, a watch type communicator, and a mobile phone.

* * * * *